United States Patent
Habitz et al.

(10) Patent No.: US 7,489,204 B2
(45) Date of Patent: Feb. 10, 2009

(54) METHOD AND STRUCTURE FOR CHIP-LEVEL TESTING OF WIRE DELAY INDEPENDENT OF SILICON DELAY

(75) Inventors: Peter A. Habitz, Hinesburg, VT (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 762 days.

(21) Appl. No.: 11/160,603

(22) Filed: Jun. 30, 2005

(65) Prior Publication Data

US 2007/0001682 A1    Jan. 4, 2007

(51) Int. Cl.
*G01R 23/00* (2006.01)
*H03B 5/24* (2006.01)
*H03K 3/03* (2006.01)

(52) U.S. Cl. .......................................... 331/44; 331/57
(58) Field of Classification Search .................... 331/44, 331/57
See application file for complete search history.

(56) References Cited

U.S. PATENT DOCUMENTS

| | | | |
|---|---|---|---|
| 4,392,105 A | 7/1983 | McLeod | |
| 6,124,143 A | 9/2000 | Sugasawara | |
| 6,204,694 B1 * | 3/2001 | Sunter et al. | 326/93 |
| 6,383,822 B1 | 5/2002 | Sprayberry et al. | |
| 6,668,346 B1 | 12/2003 | Schulz et al. | |
| 6,834,375 B1 | 12/2004 | Stine et al. | |
| 2004/0048476 A1 | 3/2004 | Jung et al. | |
| 2005/0012556 A1 | 1/2005 | Bhushan et al. | |

* cited by examiner

*Primary Examiner*—David Mis
(74) *Attorney, Agent, or Firm*—Gibb & Rahman, LLC; Michael LeStrange, Esq.

(57) ABSTRACT

Disclosed are a method and a structure for testing location-specific wire delay at a chip-level independent of silicon delay. The invention incorporates the use of a tester embedded in a metal layer of a chip. The tester comprises a ring oscillator that is selectively connected to either a first wire or a second wire by a multiplexer. A monitor measures ring frequencies of the ring oscillator when connected to either the first or second wire. A processor determines the wire delay based upon differences in the ring frequencies. Additional testers or multiple stages of a single tester may be embedded into either the same metal layer at a different location or into a different metal layer to allow for intra-metal layer or inter-metal layer comparisons of wire delay. Since metal capacitance and silicon load remains constant for both the first and second wires and the transient voltage change along the wire is hold small, metal delay is separable from delay due to silicon device performance. Pass/Fail criteria based upon a maximum allowable resistance-capacitance delay for a metal layer or based upon a comparison of resistance-capacitance delays across the same metal layer or between metal layers can be used to reject a chip.

20 Claims, 8 Drawing Sheets

METHOD AND STRUCTURE FOR CHIP-LEVEL TESTING OF WIRE DELAY INDEPENDENT OF SILICON DELAY

BACKGROUND OF THE INVENTION

1. Field of the Invention

The invention relates generally to testing of integrated circuits and, in particular, to a method and structure for chip-level testing of wire delay.

2. Description of the Related Art

Metal wire variation affects the capacitance and resistance of a wire interconnects and thereby significantly impacts the timing of semiconductor chips. As scaling of integrated circuit technologies increases so does the role that wire delay plays on overall integrated circuit delay. Metal lines are processed independently on different metal levels such that the resistance-capacitance delay on each metal layer may vary and thus, each resistance-capacitance delay on each level should be monitored. In-Line Kerf monitors are used today to periodically monitor parameters such as resistance or capacitance, independently, on semiconductor wafers. These monitors do not specifically measure wire delay. Additionally, the measurements taken by in-line Kerf monitors are gross measurements which simply indicate when the overall measured parameter for a wafer is wildly out of spec. These in-line Kerf measurements are designed for manufacturing process centering and are not used to make pass/fail decisions regarding an entire wafer based upon resistance or capacitance. However, because they do not measure delay directly and because they can not isolate a location of the delay to a particular chip or metal layer on a chip, they are not suitable for making chip-level pass/fail decisions.

SUMMARY OF THE INVENTION

The present invention provides a method and structure for chip-level testing of wire delay. An embodiment of the structure of the invention comprises an integrated circuit testing structure comprising a tester, a monitor, and a processor. The testing structure can be used to determine resistance-capacitance wire delay on a given metal layer of a chip. The tester is embedded into a chip and comprises a multiplexer, a ring oscillator electrically connected to the multiplexer, and first and second wires of different lengths electrically connected to the multiplexer. The monitor is electrically connected to the ring oscillator and measures ring frequencies of the ring oscillator. For example, the monitor can measure a first ring frequency of the ring oscillator when the ring oscillator is connected to a first long wire and a second ring frequency of the ring oscillator when the ring oscillator is connected to a second short wire. The multiplexer selectively connects the ring oscillator to either the first wire or the second wire using a switch. Resistance-capacitance delay can be determined by a processor and is approximately equal to a difference between the first ring frequency and the second ring frequency because the load on the ring oscillator is independent of the multiplexer position and gives therefore a very accurate reading. The processor can also be adapted to compare the resistance-capacitance delay to pass/fail criteria (e.g., a maximum allowable resistance-capacitance delay for the metal layer).

The first wire is longer than the second wire and can be folded (i.e., serpentine in shape) to allow for greater length. Either the length of the first wire can be varied or a third wire can be connected to the multiplexer in order to determine the dependence of resistance-capacitance delay upon wire length for a given metal layer. For example, the structure can comprise another wire (i.e., a third wire) having a different length than the first and second wires. The third wire can be electrically connected to the multiplexer and the multiplexer can be adapted to selectively connect the third wire to the ring oscillator using switches. The monitor can be adapted to measure a third ring frequency when the ring oscillator is connected to the third wire. The processor can be adapted to determine a second resistance-capacitance delay based upon a difference between the third ring frequency and the second ring frequency, to compare the first and second resistance-capacitance delays, and thereby to determine dependence of resistance-capacitance delay on wire length. The processor can also be adapted to compare a difference between these first and second resistance-capacitance delays to pass/fail criteria for the chip (i.e., second pass/fail criteria), such as a maximum allowable percentage difference between resistance-capacitance delays across a metal layer. Alternatively, the structure can comprise a first wire having a plurality of independently selectable wire segments that allow the length of the first wire to be varied. The processor can be adapted to determine a plurality of resistance-capacitance delays using first wires with variable lengths, to compare them, and thereby to determine dependence of resistance-capacitance delay on wire length.

Other embodiments of the structure comprise an additional tester that is also electrically connected to the monitor. The additional tester can be embedded into the same metal layer at another location in order to compare resistance-capacitance wire delay across a metal layer or on another metal layer to compare wire delay between layers. The additional tester can similarly comprise a multiplexer; a ring oscillator electrically connected to the multiplexer, a first wire in the metal layer electrically connected to the multiplexer; and a second wire electrically connected to the multiplexer. The multiplexer is similarly adapted to selectively connect the ring oscillator to either the first wire or the second wire using a switch. The monitor can be adapted to measure the ring frequencies of the ring oscillator of the additional tester. The processor can be adapted to determine resistance-capacitance delays corresponding to either the same metal layer or a different metal layer, as applicable, based upon the ring frequencies from the additional tester and to compare a difference between these resistance-capacitance delays. Pass/fail criteria for a chip based upon either differences between resistance-capacitance delays within the same metal layer (e.g., a second pass/fail criteria based upon a maximum allowable percentage difference between resistance-capacitance delays across a metal layer) or difference between resistance-capacitance delays from different metal layers (e.g., a third pass/fail criteria based upon a maximum allowable percentage difference between resistance-capacitance delays between metal layers) can be used to reject the chip.

An embodiment of the method is used to determine the resistance-capacitance wire delay of wiring on a chip independent of silicon delay. The method comprises measuring a first ring frequency of a ring oscillator in a metal layer of a chip when the ring oscillator is connected to a first wire in the metal layer. A switch in a multiplexer disconnects the first wire from the ring oscillator and connects a second, shorter wire. A second ring frequency of the ring oscillator is measured when the ring oscillator is connected to the second wire in the metal layer. A difference between the first and second ring frequency measurements is used to determine the resistance-capacitance delay of the metal layer. Specifically, because the load on the ring oscillator is not changing with the logical connection switch with the multiplexer, the inverters of the ring oscillator are identical then the resistance-capacitance wire delay is equal to a difference between the first ring frequency and the second ring frequency. Pass/fail criteria for a chip can be defined (e.g., a maximum allowable resistance-capacitance delay for the metal layer) and applied. Thus, if the determined resistance-capacitance delay of the metal layer is greater than the defined maximum allowable resistance-capacitance delay for that metal layer, the chip may be rejected. Additionally, using this method, a resistance-capacitance delay may be obtained for more than one location on each metal layer of a chip. A second pass/fail criteria for a chip can be defined based upon differences in resistance-capacitance delays within a metal layer (e.g., a maximum allowable percentage difference in the resistance-capacitance delays within a metal layers). Thus, if the percentage difference between the resistance-capacitance delays at different locations within a metal layer is greater than the defined maximum allowable percentage difference across the metal layer, the chip may be rejected. Also, using this method, a resistance-capacitance delay may be obtained from more than metal layer. A third pass/fail criteria for a chip may be defined based upon differences in resistance-capacitance delay between the layers (e.g., a maximum allowable percentage difference between the resistance-capacitance delays of each metal layer) and applied. Thus, if a percentage difference between the resistance-capacitance delays of different metal layers is greater than the defined maximum allowable percentage difference between layers, the chip may be rejected.

Yet another embodiment of the invention incorporates the use of a tester having a plurality of testing stages connected to a ring oscillator. Each testing stage has a separate multiplexer. Therefore, the different stages can be dedicated to measure different wires. This allows measurements to be made on every wire level or with varying wire environment in one ring oscillator. This ring can be placed in different areas of the chip to measure across chip variations in the metallization process. This embodiment can also used to measure not only wire delay but capacitance coupling.

The method may also comprise determining the dependence of resistance-capacitance wire delay upon wire length. This may be accomplished in one of two manners. A second resistance capacitance delay can be determined using a third wire having a different length than the first wire. The first and second resistance-capacitance delays can then be compared to determine resistance-capacitance delay dependence upon wire length. Alternatively, a first wire can comprise wire segments which can be selectively connected and disconnected to vary the length of the first wire. The length of the first wire can then be varied and used to determine a plurality of resistance-capacitance delays. These resistance-capacitance delays can then be compared to determine resistance-capacitance delay dependence upon wire length.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
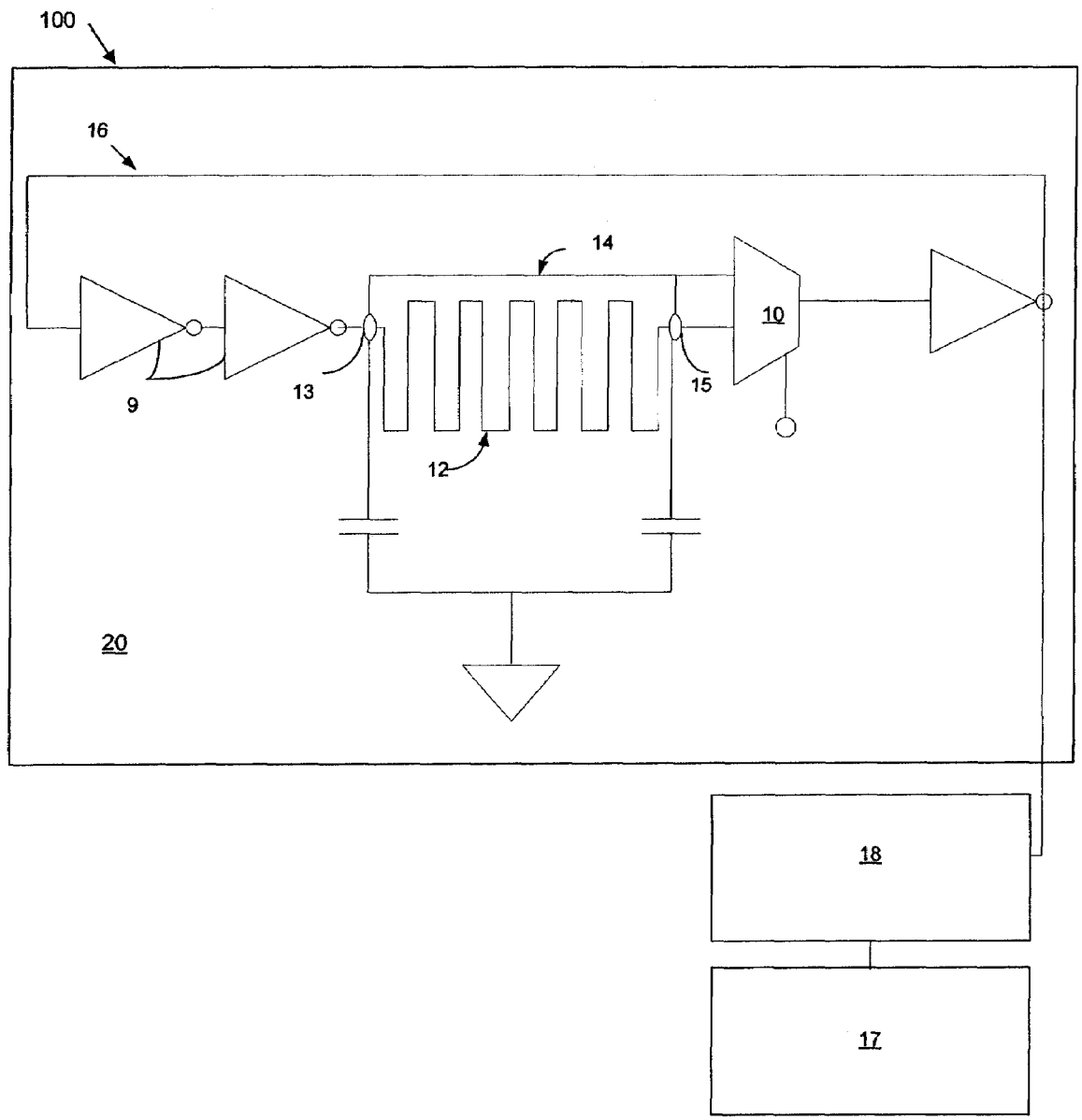
FIG. 1 is a schematic diagram of an embodiment of the testing structure of the present invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As discussed above, in-line Kerf monitors, which are designed for manufacturing process control and process centering, may also be used to independently measure parameters such as resistance or capacitance and, therefore, may be used to make general pass/fail decisions regarding an entire wafer. However, because these are gross measurements based on resistance or capacitance of an entire wafer and because they do not measure delay specifically, they are not suitable for making chip-level pass/fail decisions based upon wire delay. One method of ensuring that chip metal layers exhibit the required wire delay is to require that the chip designer to ensure functionality and performance of the chip using very wide variations in every metal layer. However, this method requires significant additional effort on the part of the chip designer. Accurate measurements of chip wire delay can be sued to reduce the tolerance margin and hence can be used to deliver a faster product. U.S. Pat. No. 6,383,822 to Sprayberry et al., May 7, 2002 (incorporated herein by reference) discloses one method for testing integrated circuit performance that measures chip operating frequency of an entire chip as a function of a self-timed pulse control parameter. U.S. Pat. No. 6,124,143 to Sugasawara, Sep. 26, 2000 (incorporated herein by reference) discloses another method for testing integrated circuit performance using long metal routing structures that pass through different metal layers and incorporate a multitude of vias. The structures are used to detect process variations that affect the resistance and capacitance of the different metal layers by measuring pulse widths. U.S. Pat. No. 4,392,105 to McLeod, Jul. 5, 1983 (incorporated herein by reference) also discloses a method for measuring turn-on and turn-off delay of a logic circuit; however, test circuit structure of McLeod does not distinguish between silicon delay and wire delay.

Thus, disclosed herein is a more practical solution that may be used to monitor location-specific chip wire delay to ensure that the wire delay meets the appropriate specifications and to ensure proper functionality of the design. The method and structure may be used to better understand interconnect related model to hardware correlation that is specific to wire delay and may be used to reject chips, as opposed to entire wafers, whose wires are manufactured outside of specifications.

Figure 3:
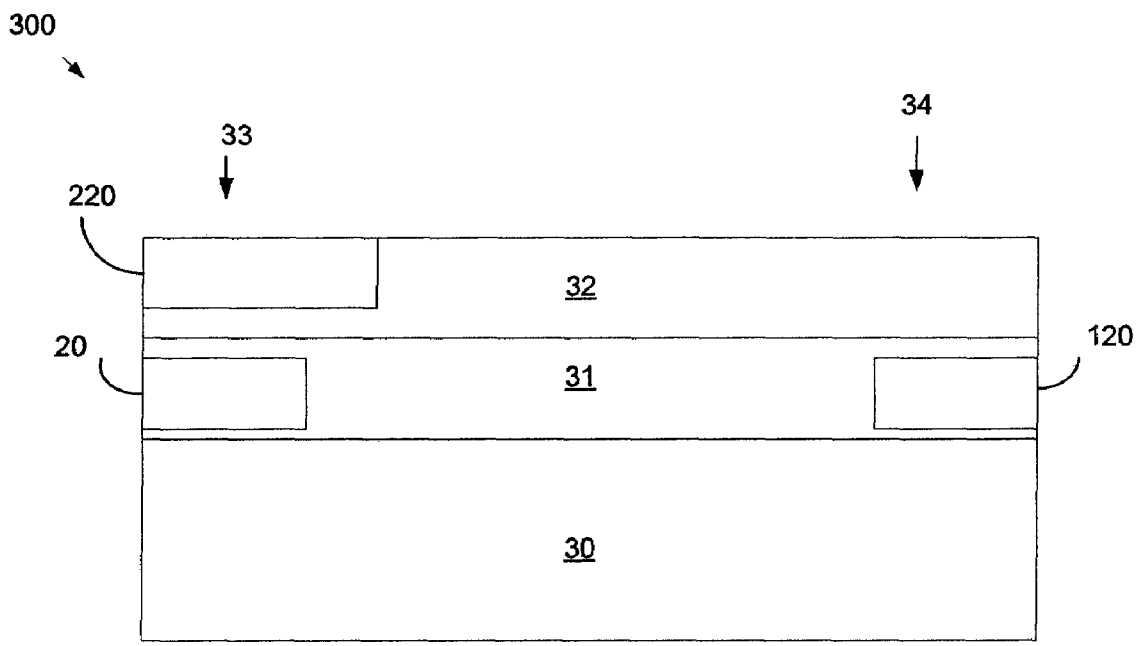
FIG. 3 is a schematic cross-sectional diagram of a chip with embedded testers.

The present invention provides a method and structure for chip-level testing of wire delay independent of silicon delay. Referring to FIG. 1, an embodiment of the structure of the invention comprises an integrated circuit testing structure 100 comprising a tester 20, a monitor 18, and a processor 17. The processor 17 may be integral with or independent of the monitor 18. The testing structure 100 can be used to determine resistance-capacitance wire delay on a metal layer of a chip. The tester 20 is embedded into a metal layer (e.g., see tester 20 in metal layer 31 on active layer 30 of chip 300 of FIG. 3) and comprises a multiplexer 10, a ring oscillator 16 electrically connected to the multiplexer 10, and first 12 and second 14 wires of different lengths electrically connected to the multiplexer 10. The first wire 12 comprises both an input 13 and an output 15. The monitor 18 is electrically connected to the ring oscillator 16 and measures ring frequencies of the ring oscillator 16. For example, the monitor 18 can measure a first ring frequency of the ring oscillator 16 when the ring oscillator 16 is connected to the first wire 12 and a second ring frequency of the ring oscillator 16 when the ring oscillator 16 is connected the second wire 14. The multiplexer 10 (e.g., a symmetrical MUX21 circuit) is adapted to selectively connect the ring oscillator 16 to either the first wire 12 or the second wire 14 (i.e., to switch between a long RC delay of first wire 12 and a short path 14 with minimum delay. By embedding these two different length paths 12 and 14 in a ring oscillator 16 (e.g., a performance screening ring oscillator (PRSO)) in a metal layer, a combination of the monitor 18 and processor 17 (e.g., standard Automated Test Equipment (ATE)) can be used to measure the ring frequencies of the two paths 12, 14 and to compare the ring frequencies 18 to determine resistance-capacitance delay. Since the inverters 9 of the ring oscillator 16 are identical and the wire loads are identical, the only item changing the ring frequency when the MUX 10 switches between paths 12, 14 is the delay from the wire RC (i.e., resistance-capacitance delay) and any off tracking between the two equally designed inputs of the MUX 10. The change in the ring frequency (i.e., the difference between the first and second ring frequencies) is, therefore, equal to the resistance-capacitance delay. Specifically, due to the fact that the metal capacitance and silicon load remains constant for each of the first wire and the second wire when connected to the ring oscillator, silicon and metal delay are separable and location-specific wire delay can be determined. This implementation relies on the use of a balanced multiplexer 10, where the input pin capacitance and delay for each wire 12, 14 is balanced in the design. The processor 17 further compares the resistance-capacitance delay to pass/fail criteria (e.g., a maximum allowable resistance-capacitance delay for the metal layer) and can reject a chip, accordingly.

Figure 2:
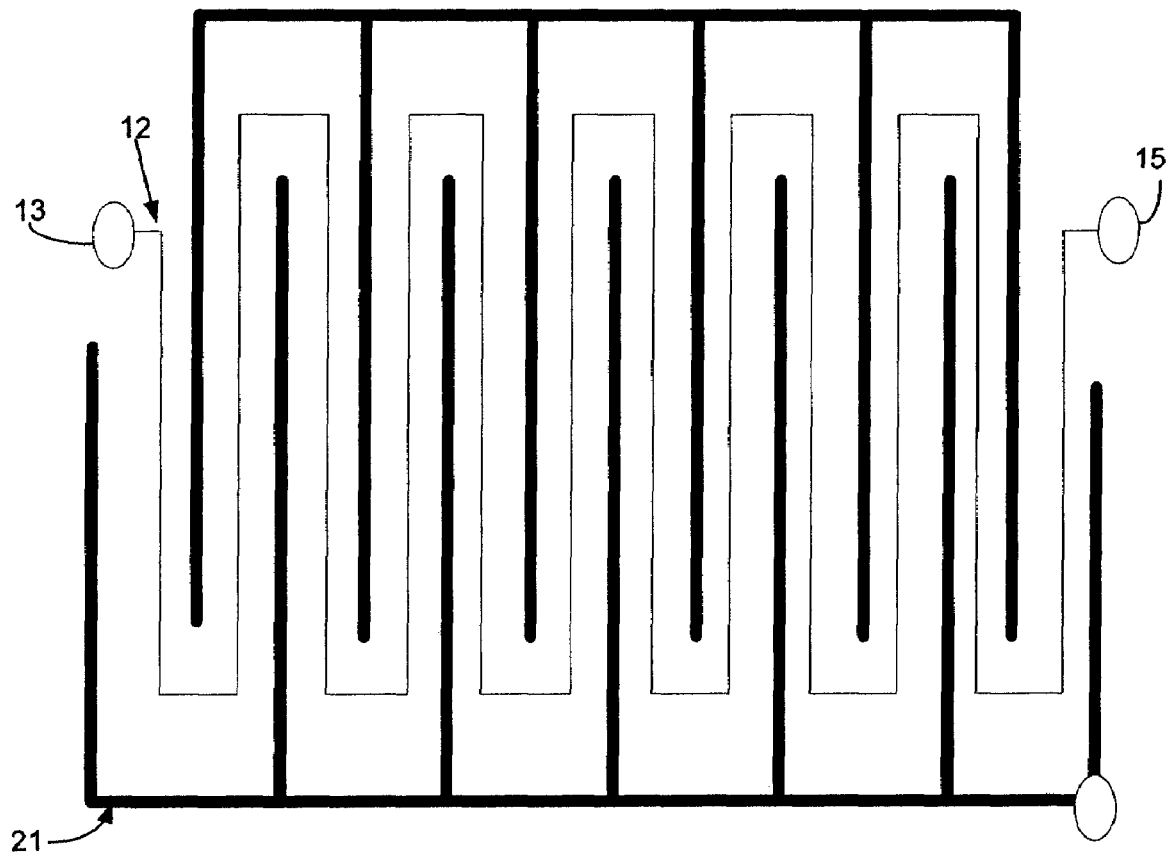
FIG. 2 is a schematic diagram of an exemplary first wire of a tester.

Referring to FIGS. 1 and 2 in combination, the first wire 12 is longer than the second wire 14. The first wire 12 can be folded in a snake-like manner to allow a large difference in the length and thus, the delay, between the first and second wires 12, 14. Dimensions of the first wire 12, and particularly, the folds of the first wire can be varied as to length, width, spacing, etc. For example, the length of the folds can vary between approximately 0.5 mm and 2 mm (10 to 240 ps) and have greater than 20 fingers. Additionally, different stages can be designed with different fold lengths (e.g., 0.5 mm, 1 mm, 1.5 mm, 2 mm, etc.). The first wire 12 is located in a net and can additionally be positioned adjacent to different net 21 connected to ground.

Figure 5:
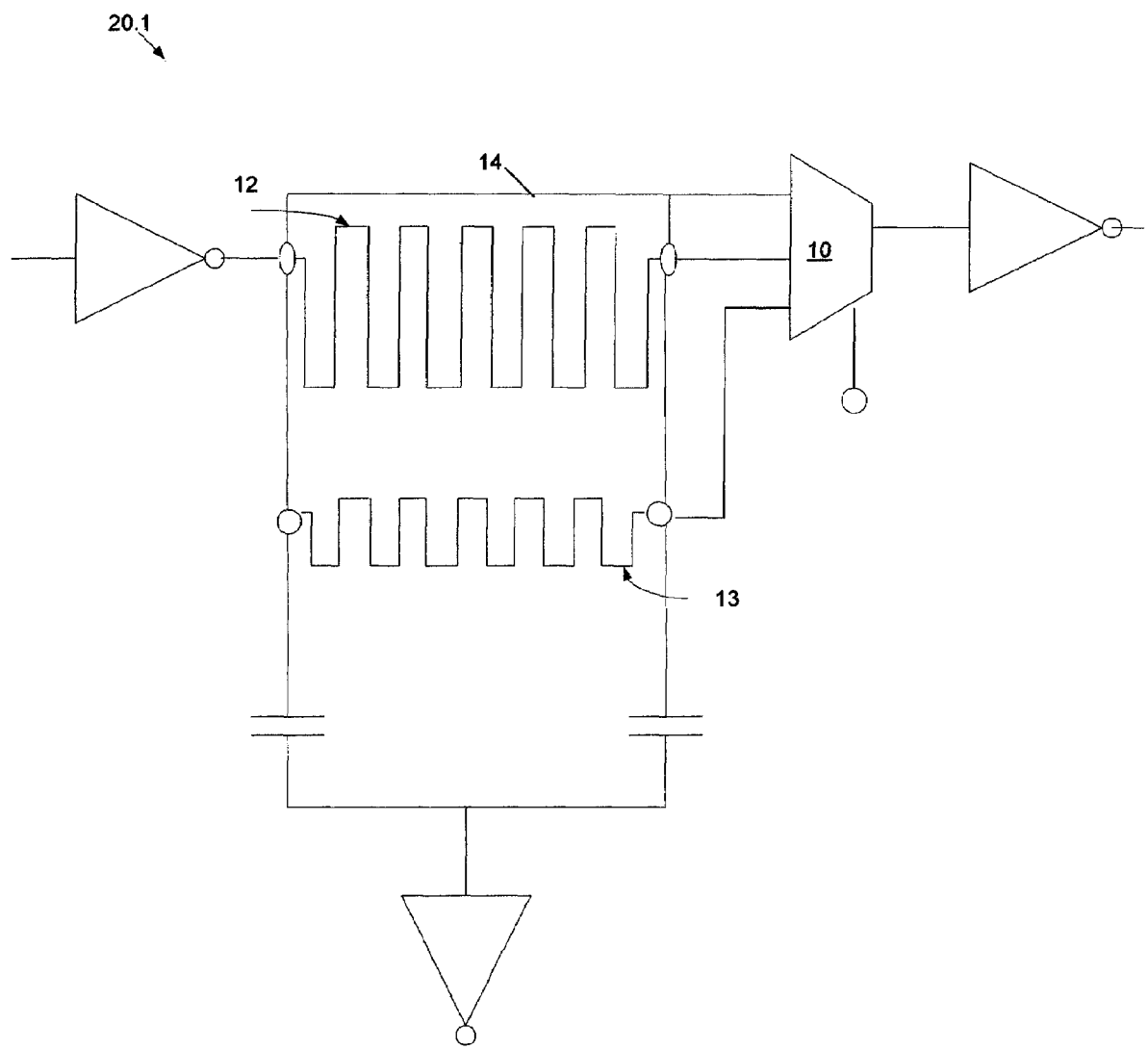
FIG. 5 is a schematic diagram of an exemplary tester.
Figure 6:
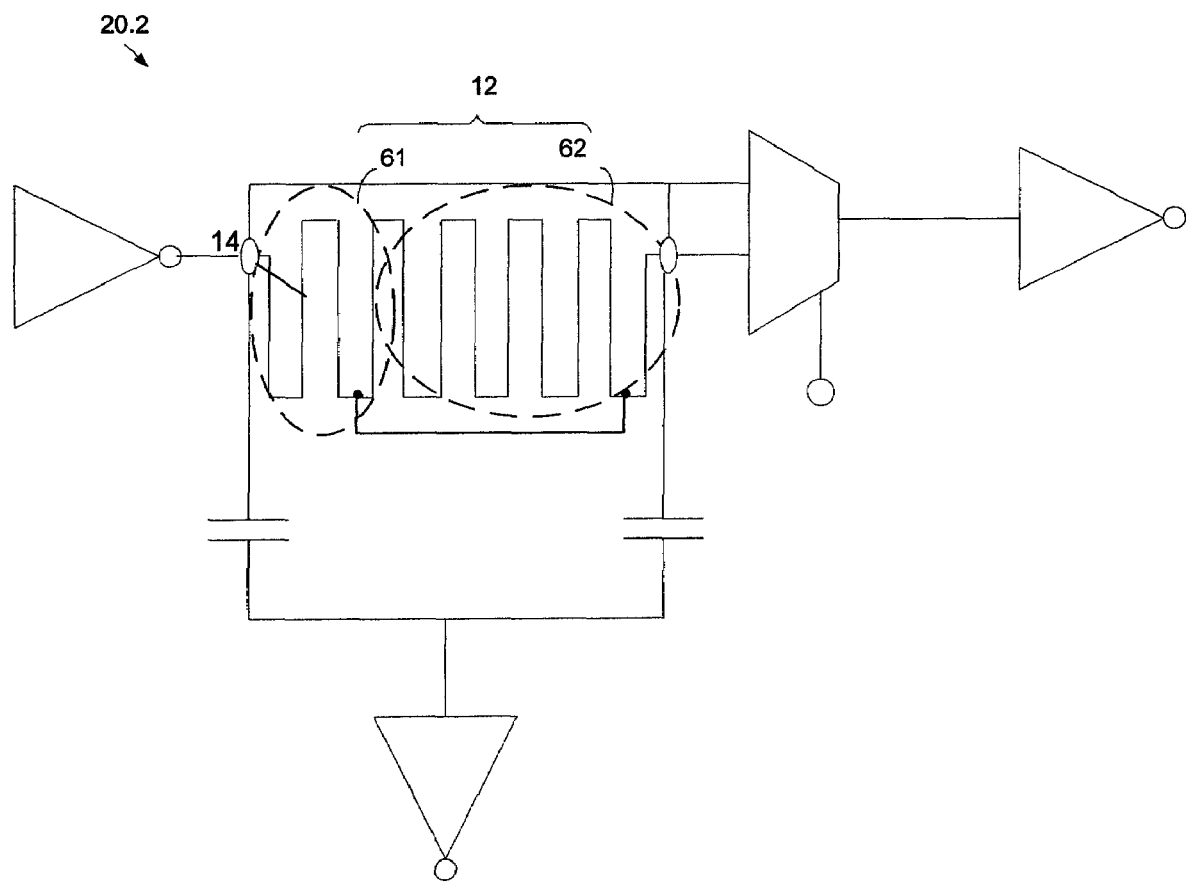
FIG. 6 is a schematic diagram of another exemplary tester.

The dependence of resistance-capacitance delay upon wire length for a metal layer can be determined by varying the structure of the invention. For example, referring to FIG. 5 a modification of tester 20 is illustrated, the tester 20.1 can comprise a third wire 13, having different length than said first wire 12. The third wire 13 can be electrically connected to the multiplexer 10 and the multiplexer 10 can be adapted to selectively connect the third wire 13 to the ring oscillator using switches. The monitor 10 can be adapted to measure a third ring frequency when the ring oscillator is connected to the third wire 13. The processor 17 can be adapted to determine a second resistance-capacitance delay based upon a difference between the second and third ring frequencies, to compare the first and second resistance-capacitance delays, and thereby to determine dependence of resistance-capacitance delay on wire length. Alternatively, referring to FIG. 6, another modification of the tester 20 is illustrated in which the tester 20.2 can comprise a first wire 12 having a plurality of independently selectable wire segments 61, 62 that allow the overall length of the first wire 12 to be varied. The processor 17 can be adapted to determine a plurality of resistance-capacitance delays by varying the overall length of the first wire 12 and thereby to determine dependence of resistance-capacitance delay on wire length. Referring again to FIG. 5, the first 12 and third 13 wires may be positioned in different locations in the same metal layer and the processor can be adapted to determine a difference between these resistance-capacitance delays across the metal layer (i.e., first and second resistance-capacitance delays) and to apply a second pass/fail criteria for the chip based upon an this difference (e.g., a reject criteria based upon a maximum allowable percentage difference between resistance-capacitance delays across a metal layer).

Figure 4:
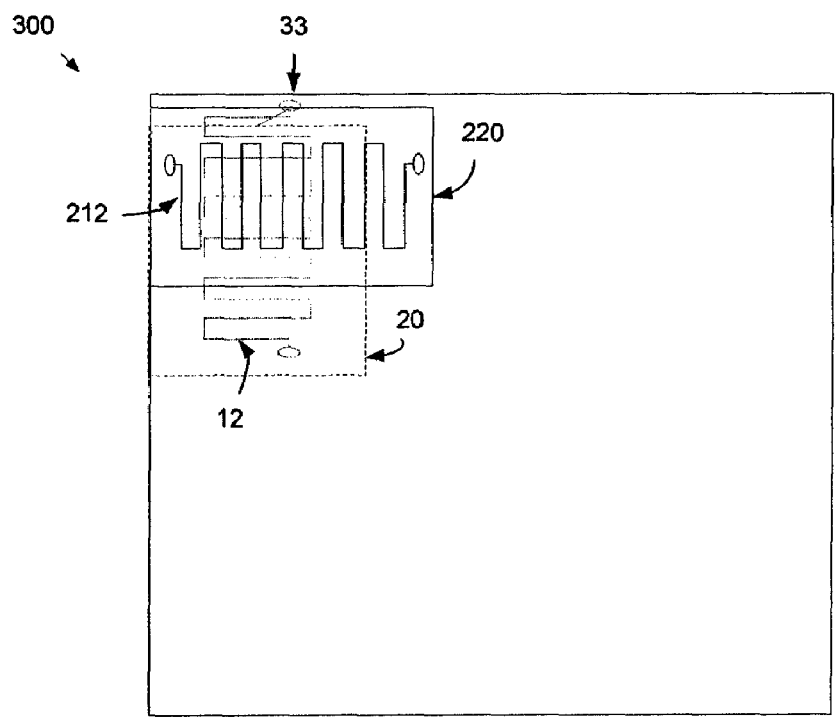
FIG. 4 is a schematic top-view diagram of a chip with embedded testers.

Other embodiments of the testing structure comprise an additional tester (e.g., see items 120, 220 of FIG. 3) that is also electrically connected to the monitor 10. The additional tester 120, 220 can be embedded into the same metal layer at another location in order to compare resistance-capacitance delay across a metal layer (e.g., see additional tester 120 in metal layer 31 above the active layer 30 of chip 300 of FIG. 3) or on another metal layer (e.g., see additional tester 220 of metal layer 32 adjacent to metal layer 31 of chip 300 of FIG. 3) to compare delay between layers (e.g., between metal layers 31 and 32). The additional tester 120, 220 can be configured the same as the first tester 20. For example, the additional tester 120, 220 can comprise a multiplexer; a ring oscillator electrically connected to the multiplexer, a first wire in the metal layer electrically connected to the multiplexer; and a second wire electrically connected to the multiplexer. The multiplexer of the additional tester 120, 220 is similarly adapted to selectively connect the ring oscillator to either the first wire or the second wire. The monitor 10 can be adapted to measure the ring frequencies of the ring oscillator of the additional tester 120, 220. The processor 17 can be adapted to determine a resistance-capacitance delay corresponding to either the same metal layer (e.g., metal layer 31) or a different metal layer (e.g., metal layer 32), as applicable, based upon the ring frequencies determined from the additional tester 120, 220. The processor can further be adapted to determine a difference between these resistance-capacitance delays and to apply a pass/fail criteria for the chip based upon either an intra-metal layer difference between resistance-capacitance delays (e.g., a second pass/fail criteria based upon a maximum allowable percentage difference between resistance-capacitance delays across a metal layer) or an inter-metal layer difference between resistance-capacitance delays (e.g., a third pass/fail criteria based upon a maximum allowable percentage difference between resistance-capacitance delays between metal layers). Note that if the additional tester 220 is adjacent to the first tester 20, then the first wires 12, 212, respectively of each tester 20, 220 should be orthogonally oriented relative to each other such that the environment is similar to that used on the chip 300 (see FIG. 4).

Figure 7:
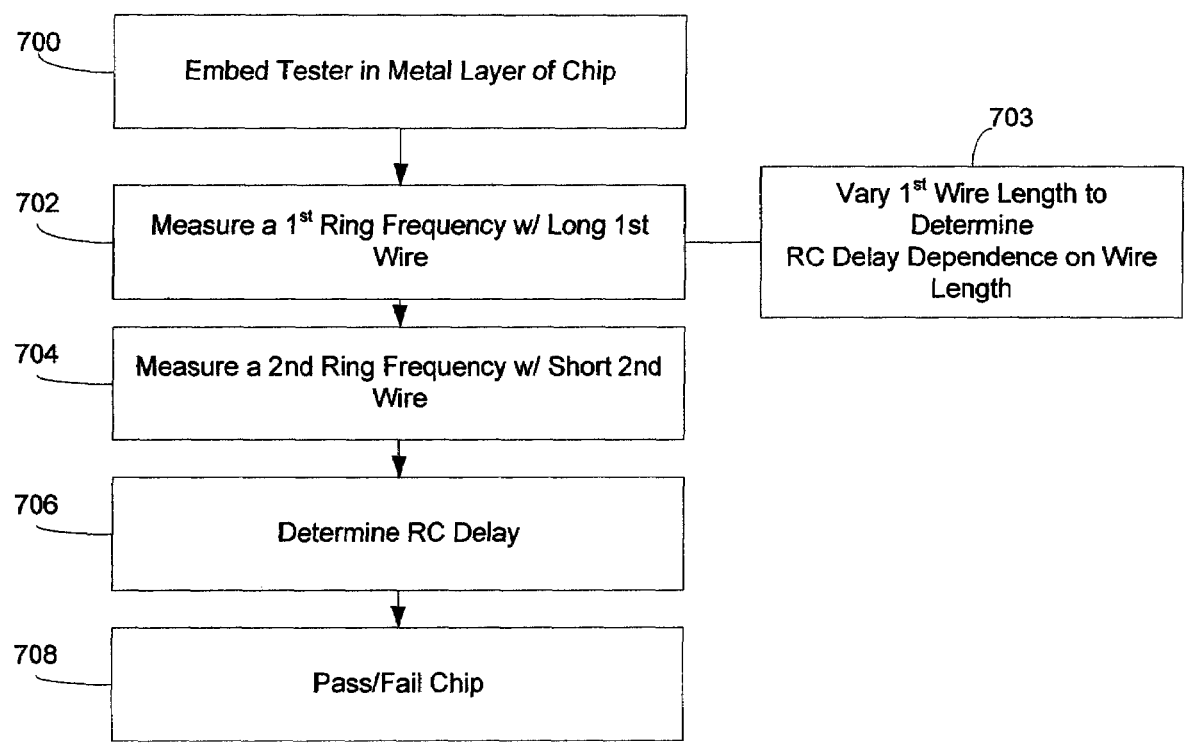
FIG. 7 is a schematic flow diagram illustrating a method of the invention.

An embodiment of the method is used to determine the resistance-capacitance delay of wiring on a chip independent of silicon delay. Referring to FIG. 7, the method comprises embedding a tester 20 into a metal layer 31 of a chip 300, as described above and illustrated in FIGS. 1-6, (700). A first ring frequency of a ring oscillator of the tester is measured when the ring oscillator is connected to a first wire in the metal layer (702). A switch in a multiplexer logically disconnects the first wire from the ring oscillator and connects a second, shorter wire, to the ring oscillator without changing the wire load on the ring. A second ring frequency of the ring oscillator is measured when the ring oscillator is connected to the second wire in the metal layer. These first and second ring frequency measurements are used to determine the resistance-capacitance delay of the metal layer (706). Specifically, if the load on the ring oscillator is constant and if the inverters of the ring oscillator are identical then, the resistance-capacitance wire delay is approximately equal to a difference between the first ring frequency and the second ring frequency. Thus, the accuracy of this separation depends on the relationship of the drive strength of the transistors driving the load with the wire delay. More specifically, the speed of the voltage change at the driving transistor node should be smaller than the wire delay, so that the transient voltage change within the wire interconnect is small. Then, a silicon device's performance can be separated from the wire delay for an accurate model to hardware correlation. A pass/fail criteria for the chip (e.g., a maximum allowable resistance-capacitance delay for the given metal layer) can be defined and applied to reject the chip (708). Thus, if the determined resistance-capacitance delay of the given metal layer is greater than the defined maximum allowable resistance-capacitance delay for that metal layer, the chip may be rejected.

Figure 8:
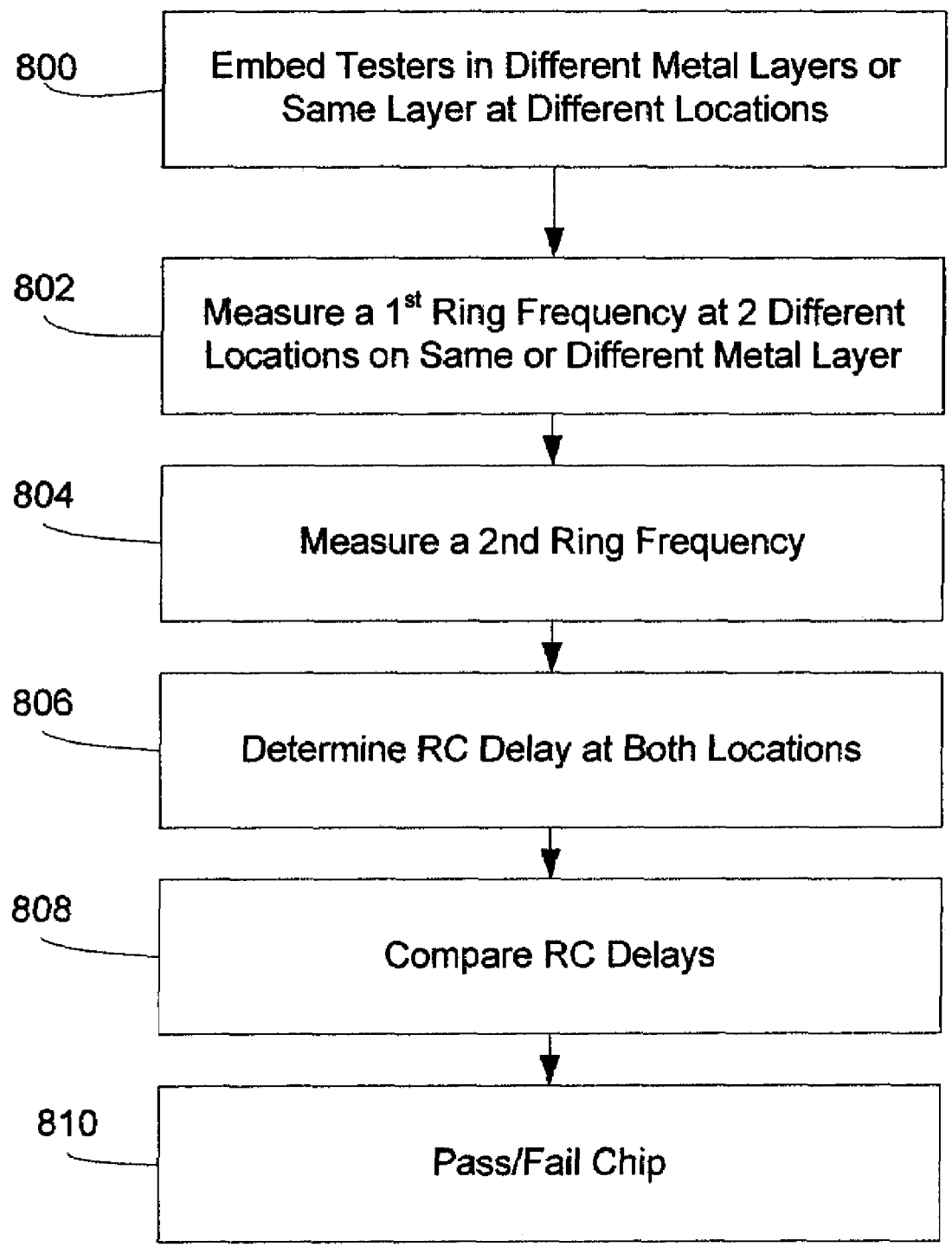
FIG. 8 is a schematic flow diagram illustrating another method of the invention; and, FIG. 9 is a schematic diagram of another exemplary tester.

Referring to FIG. 8, other embodiments of this method comprise embedding additional testers into the same layer at a different location than the first tester or into a different layer (800). For example, see the additional tester 120 of the same metal layer 31 or additional tester 220 of a different metal layer 32 of FIG. 3. A first ring frequency of each ring oscillator of each tester is measured when that ring oscillator is connected to a first wire (802). Second ring frequencies are also measured for each ring oscillator of each tester (804). RC delay is determined at each tester location based upon the measured ring frequencies (e.g., by determining a difference between a first ring frequency and a second ring frequency) (806). Using this method, a resistance-capacitance delay may be obtained for each metal layer of a chip and the resistance-capacitance delay between layers can be compared (808). Pass/fail criteria based upon inter-metal layer differences in resistance-capacitance delays (e.g., third pass/fail criteria based upon a maximum allowable percentage difference in the resistance-capacitance delay between layers) may also be defined and used to reject the chip (810). Thus, if a percentage difference between the resistance-capacitance delays of different metal layers is greater than the defined maximum allowable percentage difference between layers, the chip may be rejected. Also, using this method, a resistance-capacitance delay may be obtained from more than one location on the same metal layer and the resistance-capacitance delays across the same layer can be compared (808). As discussed above, since the load is constant and the inverters of the ring oscillator are identical, the resistance-capacitance wire delay is approximately equal to a difference between the first ring frequency and the second ring frequency regardless of the location. Thus, a silicon device's performance can be separated from the wire delay for an accurate model to hardware correlation. Pass/fail criteria based upon intra-metal layer differences in resistance-capacitance delay (e.g., a second pass/fail criteria based upon a maximum allowable percentage difference across the metal layer) may also be defined and used to reject the chip (81). Thus, if the percentage difference between the resistance-capacitance delays at different locations on the same metal layer is greater than the defined maximum allowable percentage difference across the metal layer, the chip may be rejected.

Referring again to FIG. 7, the method may also comprise determining the dependence of resistance-capacitance delay upon wire length (703). This may be accomplished in one of two manners. First, a third wire on the metal layer having a different length than the first wire may be used to determine a third ring frequency. A difference between this third ring frequency and the second ring frequency can be determined to find a second resistance-capacitance delay. The first and second resistance-capacitance delays can be compared in order to determine resistance-capacitance delay dependence upon wire length. Alternatively, a first wire can comprise wire segments which can be selectively connected and disconnected to vary the length of the first wire. The length of the first wire can then be varied and used to determine a plurality of resistance-capacitance delays. These resistance-capacitance delays can then be compared to determine resistance-capacitance delay dependence upon wire length.

Figure 9:
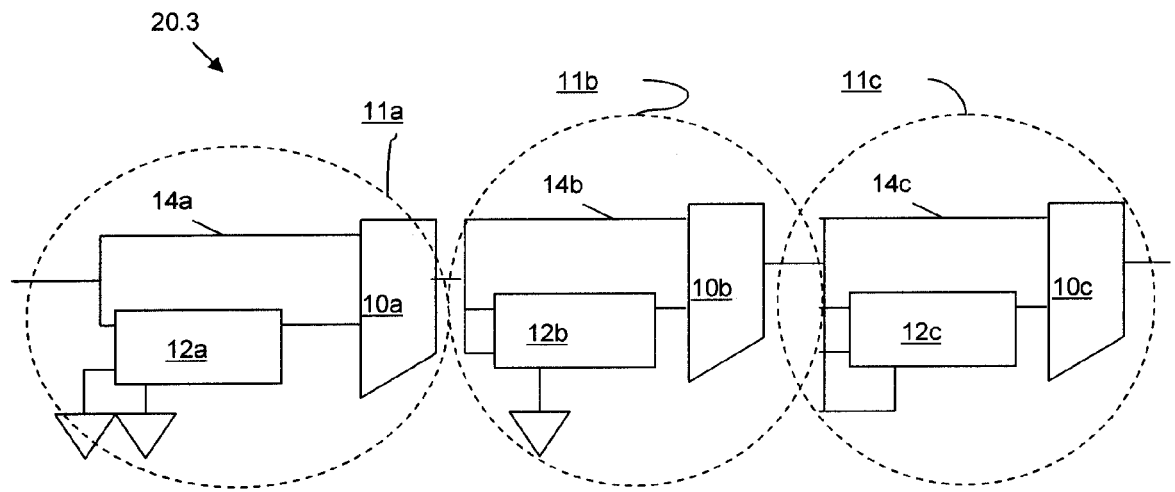

Lastly, referring to FIG. 9, yet another embodiment of the invention incorporates the use of a tester 20.3 with a ring oscillator and a multitude of testing stages (e.g., 11*a*, 11*b*, 11*c*, etc.), each having a separate multiplexer (e.g., 10*a*, 10*b*, 10*c*, etc.) and positioned at different locations (e.g., on different metal layers or on same layer at different locations) on a chip. Therefore, the different stages (e.g., 11*a*, 11*b*, 11*c*, etc.) can be dedicated to measure different wires. This allows measurements to be made on every wire level or within a varying wire environment on the same level using one ring oscillator. The processor can be adapted to make comparisons between resistance capacitance delays measured from the different locations of the different testing stages. This embodiment can also used to measure not only delay but capacitance coupling. For measuring capacitance coupling, the tester 20 of the invention is modified as illustrated by tester 20.3. Specifically, the tester 20.3 can consist of many different stages or cells. For example, each tester can have approximately 60 stages (e.g., 11*a*, 11*b*, 11*c*, etc.) electrically connected to a ring oscillator. Each stage is electrically connected to a separate corresponding multiplexer (e.g., 10*a*, 10*b*, 10*c*, etc.). Because each cell multiplexer (e.g., 10*a*, 10*b*, 10*c*, etc.) is separately addressable, a large number of detailed measurements can be done efficiently with a single ring-oscillator design. For example, each stage (e.g., 11*a*, 11*b*, 11*c*, etc.) can measure a delay at a different metal level and can also separate out coupling capacitance from load capacitance at different wire locations on the same net. Because the test-structure 20.3 is imbedded in a chip it will pick up variations due to the density of patterns in the environment of the test ring oscillator. Such density effects have been observed in the metal polishing step of modern semiconductor manufacturing. As with the previously described embodiments, at this stage (e.g., 11a) the multiplexer (e.g., 10) selects between a first long wire 12a and a second short wire 14a. Referring to FIG. 9 in combination with FIG. 2, the tests for capacitance coupling can be done, for example, with first and second nets 21, 12 being connected and a second test, at a different stage of the ring, with the two nets being separated and net 12 tied to AC ground. In the first experiment, when 21 and 12 are wired together the coupling is not part of the wire delay and the load of net 12 and in the second it is part of the load of net 12. The difference of the ring delay between these two experiments is caused by the coupling capacitance between nets 12 and 21. This method can be generalized to include different interactions and allows for measurements of the components of the coupling capacitance between different nets. Furthermore, the resistance of the connecting first wire 12 does not change during this experiment, the nets are only connected at one point in there structure. So this test can even exclude the resistance and will measure the coupling capacitance alone. Note however, that the accuracy of the capacitance coupling measurement may be slightly compromised as the tests compared are from different stages and the structures. Even if the stages and structures are designed identically, they can exhibit slightly different properties. To be a part of the measurement quality explained in this invention it is necessary that the delays compared are from the same stage and only separated by the setting of the multiplexer.

Accordingly, the invention provides a method and structure for testing wire delay on integrated circuits and, particularly, for testing at the chip-level wire delay that is independent of silicon delay. The invention may also be used to test capacitance coupling at the chip-level. The invention incorporates the use of a tester embedded in a metal layer of a chip. The tester comprises a ring oscillator that is selectively connected to either a first wire or a second wire by a multiplexer. A monitor measures ring frequencies of the ring oscillator when connected to either the first wire or the second wire. A processor determines the resistance-capacitance delay based upon differences in the ring frequencies. Additional testers may be embedded into either the same metal layer at a different location or into a different metal layer to allow for intra-metal layer or inter-metal layer comparisons of resistance-capacitance delay. Due to the fact that the metal capacitance and silicon load remains constant for each of the first wire and the second wire when connected to the ring oscillator, silicon and metal delay are separable and location-specific wire delay can be determined. Pass/Fail criteria such as a maximum allowable resistance-capacitance delay for a metal layer or a maximum percentage difference between resistance-capacitance delays across the same metal layer or between metal layers can be used to reject a chip. Additionally, resistance-capacitance delays determined based upon wires with different lengths can be compared in order to determine resistance-capacitance delay dependence upon wire length. While the invention has been described in terms of embodiments, those skilled in the art will recognize that the invention can be practiced with modification within the spirit and scope of the appended claims.

What is claimed is:

1. An integrated circuit testing structure comprising:
    a tester comprising:
        a multiplexer in a metal layer of a semiconductor chip;
        a ring oscillator in said metal layer electrically connected to said multiplexer;
        a first wire in said metal layer electrically connected to said multiplexer; and
        a second wire in said metal layer electrically connected to said multiplexer,
        wherein said first wire is longer than said second wire, and
        wherein said multiplexer is adapted to selectively connect said ring oscillator to one of said first wire and said second wire;
    a monitor electrically connected to said ring oscillator and adapted to measure a first ring frequency of said ring oscillator, when said ring oscillator is connected to said first wire, and a second ring frequency of said ring oscillator, when said ring oscillator is connected to said second wire; and
    a processor in communication with said monitor and adapted to determine a resistance-capacitance delay of said metal layer based upon a difference between said first ring frequency and said second ring frequency.

2. The structure of claim 1, wherein said processor is further adapted to apply a pass/fail criteria for said chip based upon a maximum allowable resistance-capacitance delay.

3. The structure of claim 1, wherein said tester further comprises a third wire in said metal layer and connected to said multiplexer,
    wherein said multiplexer is further adapted to selectively connect said third wire to said ring oscillator,
    wherein said monitor is further adapted to measure a third ring frequency of said ring oscillator when said ring oscillator is connected to said third wire, and
    wherein said processor is further adapted to determine a second resistance-capacitance delay of said metal layer based upon a difference between said third ring frequency and said second ring frequency and to apply a second pass/fail criteria to said chip based upon a difference between said first resistance-capacitance delay and said second resistance-capacitance delay.

4. The structure of claim 1, further comprising an additional tester in one of said metal layer and another metal layer of said semiconductor chip and electrically connected to said monitor,
    wherein said processor is further adapted to determine a third resistance-capacitance delay using said additional tester and to apply a second pass/fail criteria to said chip based upon a difference between said first resistance-capacitance delay and said third resistance-capacitance delay.

5. The structure of claim 3, wherein said third wire has a different length than said first wire, and wherein said processor is further adapted to compare said first resistance-capacitance delay to said second resistance-capacitance delay to determine resistance-capacitance delay dependence on wire length.

6. The structure of claim 1, wherein said first wire comprises at least two independently selectable wire segments that allow a length of said first wire to be varied, and
    wherein said processor is further adapted to determine a plurality of resistance-capacitance delays using said first wire with varied lengths, to compare said plurality of resistance-capacitance delays and to determine resistance-capacitance delay dependence on wire length.

7. The structure of claim 4, wherein said first wire of each of said tester and said additional tester comprises a folded wire structure.

8. The structure of claim 7, wherein if said first wire of each of said tester and said additional tester are located in adjacent metal layers, said folded wire structures are orthogonally oriented.

9. An integrated circuit testing structure comprising:
a tester comprising:
- a ring oscillator embedded in a semiconductor chip;
- a plurality of testing stages embedded in different locations of said chip and electrically connected to said ring oscillator; wherein each of said plurality of testing stages comprises:
  - a multiplexer that is electrically connected to said ring oscillator;
  - a first wire, wherein said first wire is electrically connected to said multiplexer; and
  - a second wire, wherein said second wire is electrically connected to said multiplexer, wherein said first wire is longer than said second wire, and wherein said multiplexer is adapted to selectively connect said first wire and said second wire to said ring oscillator; and
- a monitor electrically connected to said ring oscillator, wherein for each of said plurality of testing stages is in communication with said monitor and wherein said monitor is adapted to measure a first ring frequency of said ring oscillator, when said ring oscillator is connected to said first wires of said plurality of testing stages, and a second ring frequency of said ring oscillator, when said ring oscillator is connected to said second wires of said plurality of testing stages.

10. The structure of claim 9, further comprising a processor in communication with said monitor and adapted to determine a plurality of resistance-capacitance delays associated with each of said different locations on said chip corresponding to said plurality of testing stages.

11. The structure of claim 10, wherein said processor is further adapted to apply a pass/fail criteria for said chip based upon a maximum allowable resistance-capacitance delay at each of said different locations.

12. The structure of claim 10, wherein said processor is further adapted to make inter-metal layer and intra-metal layer comparisons between said plurality of resistance-capacitance delays.

13. The structure of claim 9, wherein each of said multiplexers of each of said testing stages is separately addressable.

14. The structure of claim 9, wherein said first wires of two of said testing stages are located on a first net;
wherein a second net is positioned adjacent said first net, wherein for one of said two testing stages said first wire and said second net are electrically connected,
wherein for another of said two testing stages said first wire and said second net are electrically separated and said first wire is tied to ground, and
wherein said processor is further adapted to determine capacitance coupling between said net and said second net based upon a difference between said first ring frequencies corresponding to said two testing stages.

15. A method of testing an integrated circuit, said method comprising:
measuring a first ring frequency of a ring oscillator on a metal layer of a semiconductor chip when said ring oscillator is connected to a first wire on said metal layer;
measuring a second ring frequency of said ring oscillator when said ring oscillator is connected to a second wire on said metal layer, wherein said first wire and said second wire have different lengths; and
determining a location-specific resistance-capacitance delay based upon a difference between said first ring frequency and said second ring frequency.

16. The method of claim 15, further comprising defining a pass/fail criteria for said chip based upon a maximum allowable resistance-capacitance delay and applying said chip pass/fail criteria.

17. The method of claim 15, further comprising:
determining second resistance-capacitance delay at another location on said metal layer; defining a second pass/fail criteria for said chip based upon a difference between said first resistance-capacitance delay and said second resistance-capacitance delay; and
applying said second pass/fail criteria.

18. The method of claim 15, further comprising:
determining another resistance-capacitance delay of another metal layer of said chip;
defining a third pass/fail criteria for said chip based upon a difference between said first resistance-capacitance delay and said other resistance-capacitance delay; and
applying said third pass/fail criteria.

19. The method of claim 15, further comprising:
determining a plurality of resistance-capacitance delays based upon first wires of varying lengths; and
determining resistance-capacitance delay dependence on wire length based upon a comparison of said plurality of resistance-capacitance delays.

20. The method of claim 15, further comprising forming said first wire by forming a folded wire structure in said metal layer.

* * * * *